United States Patent [19]

Parker, Jr. et al.

[11] 4,373,656

[45] Feb. 15, 1983

[54] METHOD OF PRESERVING THE SOLDERABILITY OF COPPER

[75] Inventors: John L. Parker, Jr., Sandston; Robert B. Ranes, Richmond, both of Va.

[73] Assignee: Western Electric Company, Inc., New York, N.Y.

[21] Appl. No.: 284,044

[22] Filed: Jul. 17, 1981

[51] Int. Cl.³ .............................................. H05K 3/22
[52] U.S. Cl. ................................ 228/203; 148/614 R; 427/96; 427/327; 228/206; 228/180 R
[58] Field of Search ............. 427/96, 327; 148/614 R; 228/180 R, 205–207, 203

[56] References Cited

U.S. PATENT DOCUMENTS

| | | |
|---|---|---|
| 2,163,984 | 2/1938 | Petkovic . |
| 2,742,369 | 4/1956 | Hatch . |
| 3,295,917 | 1/1967 | Cotton . |
| 3,864,139 | 2/1975 | Heller . |
| 3,891,470 | 6/1975 | Kotone . |
| 3,899,364 | 8/1975 | Evans . |
| 3,933,531 | 1/1976 | Sawa . |
| 4,046,620 | 9/1977 | Andraseek ........................ 427/96 |
| 4,059,218 | 11/1977 | Choby ............................... 228/207 |
| 4,123,562 | 10/1978 | Chandross ..................... 148/614 R |
| 4,134,959 | 1/1939 | Menke . |
| 4,340,167 | 7/1982 | Perker ........................... 228/180 R |

FOREIGN PATENT DOCUMENTS 53-12077   2/1978   Japan .................................. 427/96

*Primary Examiner*—John D. Smith
*Attorney, Agent, or Firm*—Joel F. Spivak

[57] ABSTRACT

A method for preserving the solderability of copper conductors comprises stabilizing a cleaned, mildly etched conductor surface with a phosphoric acid-glycol solution then immersing the surface in imidazole followed by a rinse to remove excess imidazole.

16 Claims, No Drawings

METHOD OF PRESERVING THE SOLDERABILITY OF COPPER

TECHNICAL FIELD

This invention relates to a method for preventing the corrosion of the surface of copper and copper alloy, and more particularly, to such method by surface treating the copper and copper alloy so as to preserve the solderability of the copper or copper alloy primarily for use in copper printed circuits.

BACKGROUND OF THE INVENTION

Most printed circuit boards employ copper as the metal which defines the conductive circuit paths of the printed circuit board. It is not infrequent after the manufacture of the printed circuit to store the printed circuit boards for substantial periods of time before further processing, such as by insertion of circuit elements and devices and soldering of these materials to the circuit board. Due to the fact that copper or copper containing metal is gradually contaminated by the atmosphere, the solderability of the copper over time decreases. In the past, it has been found necessary in order to preserve the solderability of the copper on printed circuit boards, that solder be plated onto the copper immediately or shortly after the bare board is complete. While this method has been effective in preserving the solderability of the boards, it is time consuming and costly and results in problems, e.g., shorts on fine line, high density printed circuits. Consequently, other means for preserving the solderability of copper in printed circuit boards is desired.

The use of various azoles to inhibit corrosion of copper surfaces is known in the art. For example, U.S. Pat. No. 3,295,917 teaches treating the copper with benzotriazole vapor for a time sufficient to form a thin self-sustaining protective film or coating on the copper which retards or inhibits subsequent corrosion. In U.S. Pat. No. 3,891,470 the use of imidazole and substituted imidazoles are described for inhibiting corrosion of ferrous metals such as iron and steel. Further, U.S. Pat. No. 3,933,531 discloses treating the surface of copper or copper alloys with 2-alkyl imidazoles, or an acid addition salt thereof to prevent corrosion of the copper or copper alloy. More recently, U.S. Pat. No. 4,134,959 discloses a composition for preventing corrosion of metal surfaces in contact with aqueous systems which comprise azole-phosphate dopants in the aqueous systems. The useful azoles as described therein include pyrazoles, imidazoles, isoxazoles, oxazoles, isothiazoles, thiazoles and mixtures thereof. The source of phosphate ion thereof can come from materials such as phosphoric acid, disodium phosphate, sodium tripolyphosphate, tetrapotassium pyrophosphate and the like. The combined azole-phosphate system is added to the aqueous material in contact with the metal for preventing corrosion thereof in concentrations of from 0.1 to 50,000 ppm of each of the azole and the water soluble phosphate.

It may be noted that none of the above references discuss the effect of aging of a copper surface in terms of its solderability and that several of the references deal with the use of the corrosion inhibitor as a dopant in a continuously present aqueous system as opposed to a surface treatment of the metal which is then removed from the treating system and generally stored for a period of time prior to further operations, e.g., applying solder thereto. We have now discovered an improved method for treating the surface of copper conductors so as to maintain their solderability for extended periods of times.

SUMMARY OF THE INVENTION

A method for treating bare copper printed circuit boards so as to enhance the solderability after handling and/or storage for extended time periods comprises preferably first subjecting the copper surfaces to a mild etch solution, stabilizing the surface by treatment with an aqueous solution of phosphoric acid in combination with a glycol, e.g., a low molecular weight alkyl glycol and subsequently treating the surface with an azole, e.g., imidazole followed by rinsing the surface so as to remove excess azole and leave only a thin film of the azole remaining thereon.

Printed circuit boards treated in this manner may then be stored for extended periods of time, even in excess of one year, depending upon the storage conditions, while retaining solderability which is equivalent to a freshly prepared and cleaned copper surface, before assembling components thereon.

DETAILED DESCRIPTION

In the past, a preferred surface treatment designed to protect the solderability of copper conductors of a printed circuit board was by solder plating, with or without reflow soldering. Such plating was generally performed on either a freshly prepared or freshly cleaned copper surface of the printed circuit board. In addition, rosin based coatings have also been tried with varying degrees of success. Solder plating, however, is not considered compatible with the newer high density fine lined printed circuit boards. Also, certain of the rosins require very exacting usage to be routinely effective in preserving solderability while others exhibited low flash points or were environmentally poor. Still another group of compounds used to protect the solderability of printed circuit boards are the metal complexors such as benzotriazole and imidazole. Benzotriazole, however, is degraded by mild acids and breaks down at temperatures in excess of 75° C. Imidazole has been found to give good results for protecting solderability. We have now discovered a method of improving the solderability of aged bare copper printed circuit boards over extended time periods using a novel pretreatment prior to treatment with imidazole or other azoles.

In general, the novel procedure for maintaining the solderability of aged copper printed circuit boards includes the steps of (1) preferably precleaning the surface with a mild etchant such as a persulphate etch solution as known in the art, (2) stabilizing the surface by treating it with an aqueous solution of a mixture of an acid phosphate and an alkyl glycol, preferably a phosphoric acid/ethylene glycol mixture, and (3) treating the stabilized surface with a water soluble azole such as imidazole and finally rinsing the surface thoroughly to remove most of the azole, leaving only a thin film thereof on the surface.

While the invention has only been reduced to practice by using a phosphoric acid/ethylene glycol aqueous stabilizing solution followed by treatment with imidazole, it is believed that other acid phosphate/alkyl glycol stabilizing solutions can be employed as well as other azoles. For example, one may replace ethylene glycol with propylene glycol or other similar glycols and/or one may use other azoles which may be effective, although not as effective as imidazole, such as those found with reference to U. S. Pat. Nos. 3,933,531 and 4,134,959 which are included herein by reference.

The test for solderability used to determine the effectiveness of the novel treatment as compared to prior art treatments and variations of the novel treatment were performed after aging test printed circuit boards in both real time and under accelerated conditions. The test included both visual and electrical tests of the aged circuits upon soldering thereof. The soldered circuits were examined for non-soldered joints and partially soldered joints which can cause opens in the circuit and also at times were examined for solder shorts. Particular attention was paid to the solderability of through holes. Other tests employing a meniscograph involve subjective visual tests of the soldered surface as well as the determination of the time required to reach equilibrium soldering as determined by submerging a test circuit or portion thereof 3 millimeters deep into a 60/40 tin-lead solder at about 260° C. after dipping in a suitable flux. This was carried out automatically using a General Electric Limited meniscograph. Generally, bare, freshly cleaned copper will solder to equilibrium in 1½ to 2 seconds. Since there is a correlation between soldering times in excess of 3-4 seconds and observed spasmodic dewetting under standard wave soldering operations, wetting times found by the meniscograph should be no greater than 3½ seconds to assure almost 100% solderability based upon visual examination. For some applications 5 second equilibrium times may be acceptable, however, 5 second times statistically result in only about 50% of the solder joints being acceptable.

For comparative purposes the solderability of circuits treated by mild etching alone; etching followed by treatment with stabilizer alone; etching followed by imidazole treatment without the stabilizer pretreatment and the novel process of etching followed by treatment with stabilizer and then imidazole were carried out. It may be noted that one of the observed results of these tests was that the imidazole treatment of the printed circuit boards performed without previously stabilizing the surface and subsequent to etching was extremely time critical in that in order for the imidazole to be effective in protecting the solderability of the surface, the printed circuit could not have a dwell time between bath treatments of more than about 45 seconds before deterioration in solderability was observed. In comparison, dwell times, for practical purposes was not a problem when the circuit was stabilized with the stabilizing solution prior to treatment with imidazole. For practical manufacturing operations, allowable dwell times should exceed several minutes. Another result of the many tests performed indicated the criticality of performing an adequate rinse step subsequent to imidazole treatment. It was found that without the rinse or with an inadequate rinse, solderability is poor while well-rinsed samples treated in accordance with the novel method are readily solderable after aging. It is believed that without an adequate final rinse, the protective coating of the imidazole may be excessively thick thereby inhibiting solder wetting at the time of soldering.

EXAMPLE I

The novel procedure is described with reference to a flexible printed circuit treated by means of a roll to roll process wherein the printed circuit is fed from a feed roll through various processing tanks and finally onto a take-up roll. In accordance with the preferred process, the printed circuit is preferably first cleaned as is well known in the art by means of any non-commercial or commercially available cleaning solution sold for this purpose. The cleaned board is then rinsed for 1 minute in deionized water and subsequently treated with a mild aqueous etch solution comprising 1.5 lbs. of sodium persulfate per gallon of water held at about 90° F. for 1 minute with mild agitation. After etching, the printed circuit is again rinsed for 1 minute in deionized water and then stabilized by treatment for 1 minute in a bath comprising a 50—50 mixture of deionized water and a stock solution comprising 68.6 g of 85% phosphoric acid solution, 7.5 g ethylene glycol and 23.9 g distilled water. After stabilizing, the circuit is again given a 1 minute deionized water rinse and then is immersed in a stirred bath containing 2.3 g/l imidazole in water at 140° F. for 1 minute. The imidazole treated circuit is then given 2-5 seconds deionized water immersion rinses and then dried with warm air. The circuits prepared in this manner may then be stored (or aged) for extended periods of time before assembling and soldering components thereon without adversely effecting solderability to the copper circuit.

EXAMPLE II

For comparative purposes circuits were treated with Enstrip TL-106 (a commercially available solder stripping solution sold by Enthone, Inc. Westhaven, Conn.) and the persulfate solution alone, rinsed, dried and aged prior to soldering.

EXAMPLE III

For comparative purposes circuits were treated in accordance with the procedure of Example I except the imidazole treatment was omitted. These circuits were also rinsed, dried and aged prior to soldering.

EXAMPLE IV

For comparative purposes circuits were treated in accordance with the procedure of Example I except that the stabilization treatment with the phosphoric acid-ethylene glycol solution was eliminated. These circuits were also dried and aged prior to soldering.

It was found that circuits aged for 18 hours at 95° F. and 90% relative humidity (accelerated aging estimated as being equivalent to about ¾ months of storage under normal room temperature and humidity conditions) in accordance with Example II exhibited visually poor solderability and had meniscograph equilibrium times in excess of 10 seconds. Samples aged in the same manner but which were treated in accordance with Example III were surprisingly even worse than the cleaned and etched samples of Example II in that the circuit was not even wet by the solder according to the meniscograph test results.

The tables shown below give the meniscograph equilibrium time in seconds for samples prepared in accordance with the procedures of Example I and Example IV and which were aged for 18 hours at 95° F. and 90% relative humidity. The results are shown as a function of dwell time of the samples in the air, i.e., between bath treatments.

|  | Dwell Times | | | | | | |
|---|---|---|---|---|---|---|---|
|  | 15 sec. | 30 sec. | 60 sec. | 1 min. | 2 min. | 4 min. | 10 min. |
| Example I | 1 |  | 1.0 |  |  |  | 2.0 |

-continued

|  |  | Dwell Times | | | | | | |
|---|---|---|---|---|---|---|---|---|
|  |  | 15 sec. | 30 sec. | 60 sec. | 1 min. | 2 min. | 4 min. | 10 min. |
|  | 2 |  |  | 1.5 |  |  |  | 1.5 |
|  | 3 |  |  | 1.5 |  |  |  | 1.5 |
|  | 4 |  |  | 1.5 |  |  |  | 1.5 |
|  | 5 |  |  | 1.5 |  |  |  | 1.5 |
|  | 6 |  |  | 1.5 |  |  |  | 2.0 |
|  | 7 |  |  | 1.0 |  |  |  | 2.0 |
|  | 8 |  |  | 1.5 |  |  |  | 1.5 |
|  | 9 |  |  | 1.5 |  |  |  | 1.5 |
|  | 10 |  |  | 1.5 |  |  |  | 1.5 |
| Example IV | 1 | 2.0 | 2.0 | 3.0 | 3.5 | 4.0 | 9.5 | 20.0 |
|  | 2 | 1.5 | 2.0 | 1.5 | 2.5 | 3.5 | 10.0 | 20.0 |
|  | 3 | 1.5 | 2.0 | 3.0 | 2.5 | 4.0 | 13.5 | 20.0 |
|  | 4 | 1.5 | 2.0 | 2.0 | 3.0 | 3.5 | 20.0 | 20.0 |
|  | 5 | 1.5 | 2.0 | 3.0 | 3.0 | 3.5 | 20.0 | 20.0 |
|  | 6 | 1.5 | 2.0 | 3.0 | 2.5 | 3.5 | 10.0 | 20.0 |
|  | 7 | 1.5 | 1.5 | 3.0 | 2.5 | 4.0 | 9.5 | 14.5 |
|  | 8 | 1.5 | 2.5 | 2.5 | 2.5 | 4.0 | 14.0 | 20.0 |
|  | 9 | 1.5 | 2.0 | 2.5 | 2.5 | 3.5 | 7.5 | 20.0 |
|  | 10 | 1.5 | 2.0 | 3.0 | 2.5 | 4.5 | 12.0 | 20.0 |

Other results wherein samples prepared in accordance with the procedure of Example IV were aged for longer periods of time indicated maximum permissible dwell times of only about 45 seconds in the absence of the stabilization step. It can be seen from the Table, that when treated in accordance with Example I (the novel process) meniscograph equilibrium times (hence solderability), were unaffected even after dwell times of 10 minutes, while treatment in accordance with Example IV resulted in increasing equilibrium times even after short dwell times.

Another factor of importance in comparing the novel process with one which omits the stabilization step is the effect on solderability after aging on circuits which have been handled by personnel on a normal production line. It has been demonstrated that even when there is no dwell time between baths, normal handling results in unacceptable solder joints on aged circuits treated with imidazole but without stabilizer, while the novel procedure is only mildly adversely affected by handling, in comparison thereto.

It may be noted that we have found that the imidazole concentration should be at least about 2.0 g/l for best results. Higher concentrations, e.g., greater than about 3 g/l while useful, will only add to the cost without added benefit and may also make the final rinse step, where ionic contamination and excess imidazole must be removed, more difficult. Further, it has been shown that an acid phosphate solution without the presence of glycol does not effectively stabilize the surface prior to azole treatment.

What is claimed is:

1. A method of preserving the solderability of a copper surface comprising:

stabilizing the surface with an aqueous solution comprising a mixture of an acid phosphate and a glycol;
treating the stabilized surface with a protective azole; and
rinsing the azole treated surface so as to remove excess azole.

2. The method recited in claim 1 wherein the acid phosphate is phosphoric acid.

3. The method recited in claim 1 wherein the glycol is a low molecular weight alkyl glycol.

4. The method recited in claim 1 wherein the stabilizing solution comprises a mixture of phosphoric acid and ethylene glycol.

5. The method recited in claims 1, 2, 3 or 4 wherein the azole is an imidazole.

6. The method recited in claim 4 wherein the azole is imidazole and wherein the concentration of concentrated phosphoric acid and ethylene glycol in the stabilizer solution is about 34 weight percent and 3.7 weight percent, respectively.

7. The method recited in multiple claim 5 wherein the imidazole concentration is at least 2 g/l.

8. The method recited in claim 6 wherein the imidazole concentration is at least 2 g/l.

9. The method recited in claim 8 wherein the imidazole is heated to about 140° F. and the surface is contacted with the imidazole for about 1 minute.

10. The method recited in claim 1 wherein the surface is exposed to a mild etching solution prior to stabilization.

11. The method recited in claim 10 wherein the mild etching solution comprises a soluble persulfate.

12. A method of preserving the solderability of a copper surface comprising:

etching the surface with a mild etching solution comprising a soluble persulfate;
stabilizing the etched surface with an aqueous solution comprising phosphoric acid and an alkyl glycol;
treating the stabilized surface with imidazole; and
rinsing the imidazole treated surface so as to leave only a thin protective film of imidazole remaining.

13. The method recited in multiple claim 5 wherein the copper surface comprises the conductors of a printed circuit board.

14. The method recited in multiple claim 5 wherein the copper comprises the conductors of a printed circuit board and including the step of soldering circuit components on said printed circuit board.

15. The method recited in claim 12 wherein the copper surface comprises the conductors of a printed circuit board.

16. The method recited in claim 12 wherein the copper comprises the conductors of a printed circuit board and including the step of soldering circuit components on said printed circuit board.

* * * * *